United States Patent [19]

Anthony et al.

[11] Patent Number: 5,190,823
[45] Date of Patent: Mar. 2, 1993

[54] METHOD FOR IMPROVING ADHESION OF SYNTHETIC DIAMOND COATINGS TO SUBSTRATES

[75] Inventors: Thomas R. Anthony, Schenectady; James F. Fleischer, Scotia, both of N.Y.

[73] Assignee: General Electric Company, Schenectady, N.Y.

[21] Appl. No.: 653,556

[22] Filed: Feb. 11, 1991

Related U.S. Application Data

[63] Continuation-in-part of Ser. No. 386,737, Jul. 31, 1989, abandoned.

[51] Int. Cl.$^5$ .............................. B32B 7/00; B05D 3/06
[52] U.S. Cl. ..................................... 428/408; 427/249; 427/122; 427/590; 428/457; 428/698; 423/446
[58] Field of Search .................. 427/38, 39, 45.1, 249, 427/122; 423/446; 428/408; 156/DIG. 68

[56] References Cited

U.S. PATENT DOCUMENTS

| | | | |
|---|---|---|---|
| 3,170,859 | 2/1965 | Boudart | 427/249 |
| 4,915,977 | 4/1990 | Okamoto et al. | 423/446 |
| 4,925,701 | 5/1990 | Jansen et al. | 427/45.1 |
| 4,987,002 | 1/1991 | Sakamoto et al. | 427/34 |
| 4,989,542 | 2/1991 | Kamo | 423/446 |
| 5,009,923 | 4/1991 | Ogata et al. | 427/249 |
| 5,023,109 | 6/1991 | Chin et al. | 427/45.1 |

FOREIGN PATENT DOCUMENTS

| | | |
|---|---|---|
| 60-192326 | 9/1985 | Japan . |
| 61-155295 | 7/1986 | Japan ................................ 423/446 |
| 62-034704 | 2/1987 | Japan . |
| 62-085956 | 4/1987 | Japan . |
| 01062457 | 3/1989 | Japan . |
| 62086161 | 4/1989 | Japan . |
| 01157412 | 6/1989 | Japan . |

Primary Examiner—Shrive Beck
Assistant Examiner—Roy V. King
Attorney, Agent, or Firm—William H. Pittman

[57] ABSTRACT

Adhesion of diamond coatings formed by chemical vapor deposition to substrates, particularly molybdenum substrates, is improved by employing an auxiliary substrate comprising elemental or chemically combined silicon, from which a silane is believed to diffuse to the principal substrate, where it is reduced to silicon and deposits thereon.

6 Claims, No Drawings

METHOD FOR IMPROVING ADHESION OF SYNTHETIC DIAMOND COATINGS TO SUBSTRATES

This application is a continuation-in-part of copending application Ser. No. 07/386,737 filed July 31, 1989, now abandoned.

This invention relates to the chemical vapor deposition of diamond, and more particularly to the improvement of adhesion to a substrate of a diamond coating thus deposited.

Various methods are known for the synthetic production of diamond. In particular, the deposition of diamond coatings on substrates to produce cutting and abrasive tools is known.

One class of methods developed in recent years for synthetic diamond deposition consists of the chemical vapor deposition (hereinafter sometimes "CVD") methods. For a general summary of various diamond deposition methods including CVD methods, reference is made to *Chemical & Engineering News*, 67(20), 24-39 (May 15, 1989), incorporated herein by reference.

In the CVD methods, a mixture of hydrogen and a hydrocarbon gas such as methane is thermally activated and passed into contact with a substrate. The hydrogen gas is converted to atomic hydrogen which reacts with the hydrocarbon to form elemental carbon, which deposits on the substrate in the form of diamond. Many of the CVD diamond coating methods, hereinafter referred to as "filament" methods, employ one or more resistance heating units including heated wires or filaments, typically at temperatures of at least 2000° C., to provide the high activation temperatures at which these conversions take place.

Relatively thick diamond coatings are required in the manufacture of such articles as cutting tools. However, a problem which often arises is the failure of thick diamond coatings to adhere to the substrate, as a result of differences in coefficient of thermal expansion between the diamond and the substrate material.

Thus, for example, cutting tools comprising a diamond layer on molybdenum are often desired. The coefficients of thermal expansion of diamond and molybdenum are so different that stresses are produced in the coating article as it cools from the temperature at which diamond deposition takes place. Thin diamond coatings are usually elastic enough to withstand such stresses, but thick coatings of the type desired on cutting tools may cause separation of diamond from the molybdenum substrate and/or catastrophic failure of the diamond layer in the form of severe cracking and fragmentation.

The present invention provides a method for improving adhesion between CVD produced diamond and improved diamond-coated articles produced by said method.

The invention is a method for improving adhesion of a diamond coating produced by chemical vapor deposition on at least one substrate which comprises conducting the deposition operation in the presence of an auxiliary substrate comprising silicon in elemental or combined form.

The CVD method for diamond deposition is known in the art and disclosed in many patents and publications, and therefore it need not be dealt with in detail here. In brief, it involves the passage of a mixture of hydrogen and a hydrocarbon gas, normally methane, the latter comprising up to about 2% by volume of said mixture, into a chamber containing one or more substrates to receive the diamond coating. The conditions employed are such as to activate the gas mixture by converting molecular hydrogen to atomic hydrogen, and this may be achieved by such means as high frequency and thermal excitation.

It is often convenient to employ one or more heated filaments in the deposition chamber to achieve temperatures on the order of 2000° C. or above, thus causing the formation of atomic hydrogen and deposition of the desired diamond layer. The material of which said filaments are comprised is not critical, any material known in the art as suitable for this purpose being acceptable. Illustrative materials are metallic tungsten, tantalum, molybdenum and rhenium; because of its relatively low cost and particular suitability, tungsten is often preferred. Filament diameters of about 0.2-1.0 mm. are typical, with about 0.8 mm. frequently being preferred.

Normally, the deposition chamber is maintained at reduced pressure, for example about 10 torr. The effluent gases are withdrawn by means of a vacuum pump or its equivalent. The orientation of the substrate and filament(s) in the chamber is not critical to the invention and may be horizontal or vertical. The filament may be in any shape such as straight, curved or spiral. Likewise, the shape, orientation and location in the deposition chamber of the substrate(s) is not critical.

Any substrate material suitable for diamond deposition thereon may be employed in the present invention. Examples of such materials are boron, boron nitride, platinum, graphite, molybdenum, copper, aluminum nitride, silver, iron, nickel, silicon, alumina and silica, as well as combinations thereof. Because the problem addressed by the invention is the result of differences in coefficient of thermal expansion between the substrate and the diamond deposited thereon, the invention is particularly useful with substrates which are characterized by large differences therein. A substrate material which is particularly notable in this respect is molybdenum, and therefore the invention is especially useful for the CVD coating of diamond on molybdenum substrates. To distinguish the above-described substrate from the silicon-containing substrate employed according to the invention as described hereinafter, the two are sometimes hereinafter respectively designated "principal substrate" and "auxiliary substrate".

The essential feature of the invention is the employment of an auxiliary substrate comprising silicon in elemental or combined form. By "combined form" is meant a compound of silicon which is at least formally capable of conversion by elemental or atomic hydrogen, under conditions for the CVD deposition of diamond, to a silane. Silicon carbide is often the preferred auxiliary substrate material.

It is believed that the effectiveness of the invention is due to the deposition of a layer of elemental silicon on the principal substrate(s) prior to the formation of the diamond coating. Said layer is believed to be produced as a result of conversion of the auxiliary substrate by elemental or atomic hydrogen to a silane, followed by vaporization of said silane, its diffusion to the principal substrate(s) and its conversion to elemental silicon. However, the invention is in no way dependent on theory.

Of course, diamond is deposited on both the principal and the auxiliary substrate, whereby the effectiveness of the latter is eventually reduced to zero. This is acceptable since the adhesion-enhancing operation is completed in a short time.

The method of this invention improves adhesion of the diamond coating to the principal substrate. This is particularly noticeable when said substrate is molybdenum, and in that case is believed to involve the reaction of silicon deposited on the principal substrate with molybdenum to form various molybdenum compounds with silicon or with both silicon and carbon. When diamond is deposited directly on molybdenum, a molybdenum carbide layer is formed; said compounds are much more adherent to elemental molybdenum than is molybdenum and to diamond carbide.

Prior to the present invention, diamond coatings on molybdenum could be deposited with a thickness only on the order of 10-20 microns before separation from the molybdenum took place. The present invention permits the deposition and adherence of layers with a thickness of at least 100 microns. Articles comprising a substrate with an adherent CVD diamond coating of this thickness on at least a portion thereof are another aspect of the invention.

The method of this invention is illustrated by an example in which two flat substrates, one of molybdenum and the other of silicon carbide, were placed parallel to each other on opposite sides of a tungsten filament at distances from the filament of about 10 mm., in a closed reaction chamber having a gas inlet and an exhaust port. The chamber was evacuated and the filament was heated to about 2000° C., after which a mixture of 98% (by weight) hydrogen and 2% methane was introduced into the chamber at a pressure of about 10 torr. Over a four-week period, passage of the hydrogen-methane mixture and heating of the filament were continued as a diamond film was grown on each of the substrates. At the end of this time, a 300-micron layer of diamond had deposited on the molybdenum substrate, with good adhesion thereto.

What is claimed is:

1. A method for improving adhesion of a diamond coating produced by chemical vapor deposition on at least one substrate which comprises thermally activating a mixture of hydrogen and a hydrocarbon gas in the presence of said substrate and an auxiliary substrate comprising silicon in elemental or combined form.

2. A method according to claim 1 wherein the substrate comprises molybdenum.

3. A method according to claim 2 wherein the auxiliary substrate comprises silicon carbide.

4. An article comprising a substrate with an adherent diamond coating with a thickness of at least 100 microns, produced by chemical vapor deposition, on at least a portion thereof.

5. An article according to claim 4 wherein the substrate comprises molybdenum.

6. An article according to claim 5 further comprising an intermediate adhesion promoting layer comprising compounds of molybdenum with silicon or with silicon and carbon.

* * * * *